United States Patent [19]

Boyer et al.

[11] 4,119,211

[45] Oct. 10, 1978

[54] METHOD AND APPARATUS FOR TRANSFERRING ARTICLES WHILE RE-ESTABLISHING THEIR ORIENTATION

[75] Inventors: John A. Boyer; Robert Cross; Ernest Kovacs; Ralph J. Valentino, all of Allentown, Pa.

[73] Assignee: Western Electric Company, Inc., New York, N.Y.

[21] Appl. No.: 734,831

[22] Filed: Oct. 22, 1976

[51] Int. Cl.² .................. B65G 47/24; B65G 47/30; B65G 47/91
[52] U.S. Cl. .............................. 214/1 BH; 198/432; 198/486; 214/1 BV; 214/1 Q; 214/152
[58] Field of Search .............. 198/412, 413, 420, 432, 198/486; 214/1 BC, 1 BH, 8.5 D, 1 BS, 1 BT, 1 BV, 152, 1 Q; 228/6 A, 49 R, 49 B, 180 A

[56] References Cited

U.S. PATENT DOCUMENTS

| | | | |
|---|---|---|---|
| 2,647,613 | 4/1953 | Launius et al. | 198/430 |
| 2,666,562 | 1/1954 | Birch | 53/247 |
| 3,066,786 | 12/1962 | Allgeyer | 198/412 |
| 3,174,789 | 3/1965 | Scherr | 214/1 BV |
| 3,235,057 | 2/1966 | Rea et al. | 198/486 X |
| 3,360,102 | 12/1967 | Cummings | 198/428 |
| 3,448,865 | 6/1910 | Schroder | 214/1 BD |
| 3,506,140 | 4/1970 | Koch et al. | 214/1 BH |
| 3,601,243 | 8/1971 | Gurgacz | 198/424 |
| 3,731,822 | 5/1973 | Fiessen et al. | 214/1 BC |
| 3,958,740 | 5/1976 | Dixon | 228/180 A |

Primary Examiner—Al Lawrence Smith
Assistant Examiner—K. J. Ramsey
Attorney, Agent, or Firm—R. Y. Peters

[57] ABSTRACT

Small articles, such as miniature ceramics having integrated circuits bonded thereon, are adjacently positioned with an initial row orientation in parallel first rows in guide tracks having a first row spacing. The first articles in each track are lifted from the tracks by a transfer arm, having rotatable vacuum pickups, along a line angular to the tracks such that the articles have a predetermined second row spacing measured along the transfer arm. The lifted articles are transferred to second rows of vacuum supports therefor by pivoting movement of the arm. The supports have pedestals in columns transverse to the second rows which are indexed into position for repeated transfer of articles thereto to form an array (or matrix) of articles having the second spacing between the second rows of the articles on the supports. A link mechanism is provided to rotate the vacuum pickups and re-establish the initial row orientation of the articles with respect to the second rows. The articles are bonded to lead frames in the inverted position. Accordingly, means are provided for inverting and accurately locating the array of articles with respect to the lead frames.

19 Claims, 13 Drawing Figures

METHOD AND APPARATUS FOR TRANSFERRING ARTICLES WHILE RE-ESTABLISHING THEIR ORIENTATION

BACKGROUND OF THE INVENTION

1. Field of the Invention

The invention relates to methods and apparatus for transferring articles and, more particularly, transferring articles from first rows of such articles having a first row spacing and an initial row orientation to second rows of said articles having a second row spacing and the same initial row orientation relative to the second rows.

2. Description of the Prior Art

Semiconductor devices, such as integrated circuits, must be connected to external circuits. One method of doing this involves first bonding the integrated circuit to a small piece of ceramic, about 0.2 inches square, termed a miniceramic, having a pattern of conductive material deposited thereon and, then, bonding leads suitable for connection to external circuits to the conductive pattern. Thus, the ceramic supports the integrated circuit and relieves it from stresses exerted by external forces on the leads.

The bonding of the leads to the conductive pattern would be tedious, time consuming and costly if done individually. These deficiencies are avoided by mass bonding. See, for example, U.S. Pat. No. 3,941,297 which issued to J. A. Burns and A. R. Sivo, Mar. 2, 1976 and is assigned to the same assignee as the instant application. However, the miniceramics must be quickly and precisely positioned in the mass bonding apparatus; for example, positioned on an insert assembly of the above-mentioned Burns et al. patent. To do this, the miniceramics must be removed from handling trays or magazines used throughout processing, wherein they abut each other in close parallel rows, and transferred to the anvil assembly where they have a widely spaced non-abutting relationship and the same row orientation as in the magazines.

In the ceramic art, kiln loaders and unloaders, as disclosed, for example in U.S. Pat. No. 3,360,102, issued to H. B. Cummings, Dec. 26, 1967 and U.S. Pat. No. 3,601,243, issued to S. S. Gurgacz, Aug. 24, 1974, may be used to transfer multiple ceramic pieces or the like from a conveyor belt to the kiln conveyor and/or vice versa. The pieces may be widely spaced on the conveyor belt but must be closely spaced on the kiln conveyor to achieve maximum kiln capacity. A pivoting vacuum pickup arm is used to remove the ceramic pieces from the conveyor belt and deposit them on the kiln conveyor. The arm includes a lazy-tong mechanism to expand or contract the distance between vacuum pickups while the arm pivots from a parallel position over one conveyor to an angular position over the other conveyor. There is no need to maintain the row orientation of, or precisely position, the pieces on either conveyor and the orientation is not maintained.

In the semiconductor art, on the other hand, the row orientation of miniceramics must be precisely maintained and the miniceramics precisely positioned for mass bonding. In addition, mechanisms for changing spacing should be avoided in order to eliminate inaccuracies introduced by play in the mechanism, if precision of positioning is to be maintained.

SUMMARY OF THE INVENTION

Accordingly, it is an object of the invention to provide new and improved methods and apparatus for transferring articles. It is another object to provide new and improved methods and apparatus for removing articles, having an initial row orientation with respect to rows of such articles having a first row spacing, along a line angular to the first rows such that the articles have a predetermined second row spacing along the line, and then depositing said articles with their initial row orientation in new rows having the second spacing.

These and other objects are accomplished, without the need of a mechanism for expanding and contracting the spacing, by providing a transfer arm, pivotable from a position at an angle acute to and over first rows of articles, such as semiconductor devices in guide tracks, to a position perpendicular to and over second rows of supports for the articles. The transfer arm includes a plurality of rotatable vacuum pickups, and locating members, for removing, maintaining, and precisely positioning one article from each row. The articles are received on the supports on an indexing vacuum table that is pivoted about one edge to position the articles above a bonding assembly for release thereto.

BRIEF DESCRIPTION OF THE DRAWINGS

Other objects and features of the invention will be more readily understood from the following detailed description of the specific embodiments thereof, when read in conjunction with the accompanying drawings in which.

DETAILED DESCRIPTION

Articles to be Transferred

Figure 1:
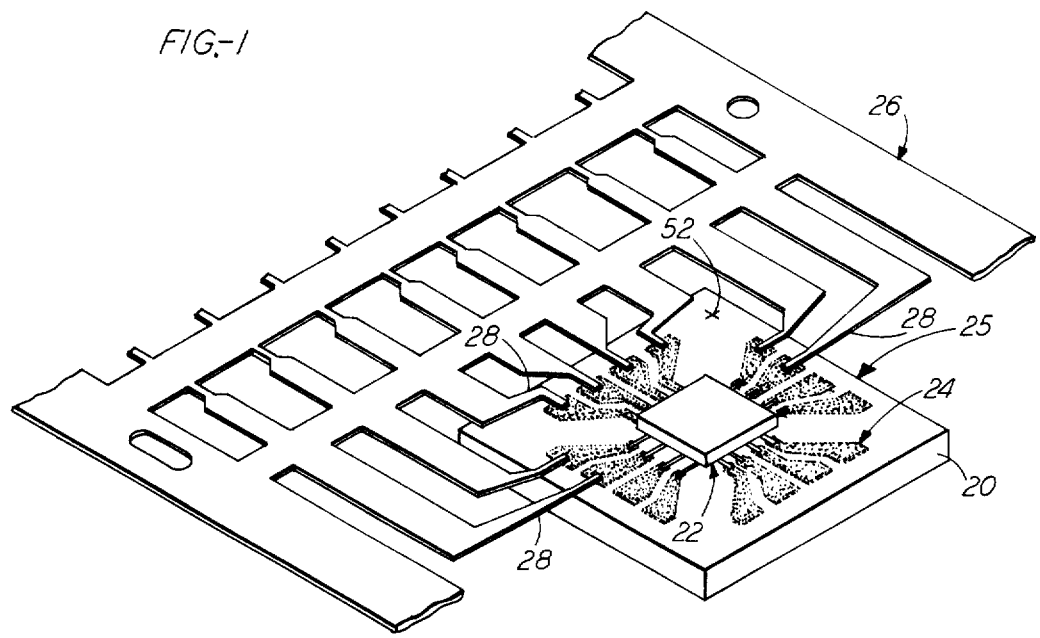
FIG. 1 is an enlarged isometric view of a miniceramic-integrated circuit assembly and a portion of a lead frame to which the assembly is bonded.

Referring to FIG. 1, a ceramic substrate 20 having a semiconductor, such as an integrated circuit 22 bonded to a pattern 24 of conductive material to form a miniceramic 25, is positioned beneath a lead frame 26 having leads 28. Only one miniceramic 25 and a portion of the lead frame 26 are shown for illustrative purposes but it is to be understood that each lead frame 26 contains plural sets of leads 28 for bonding to a plurality of miniceramics 25.

Supports from and to Which Articles are Transferred

Figure 2:
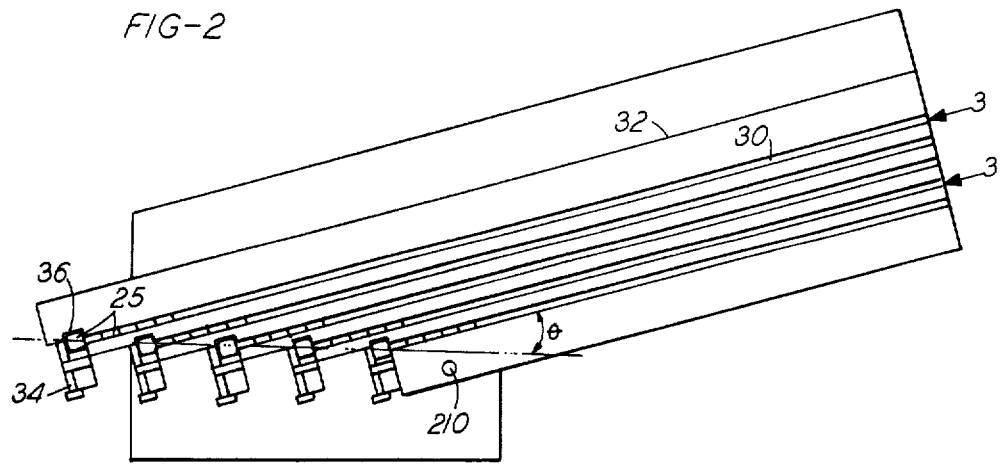
FIG. 2 is a plan view of guide tracks from which the miniceramics are removed.
Figure 3:
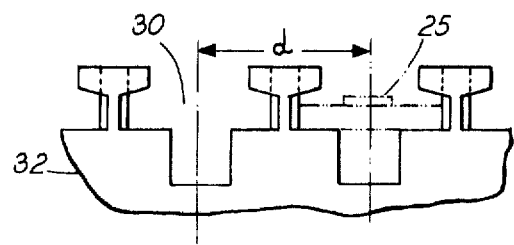
FIG. 3 is an enlarged partial end view of the guide tracks.

Referring now to FIGS. 2 and 3, the miniceramics 25 are handled in grooved trays (not shown) the grooves of which match the guide tracks 30 formed in a plate 32 and in which the miniceramics all have the same row orientation. This phrase "row orientation" is used to conveniently point out that the miniceramics are uniformly orientated with respect to the rows in which they are placed rather than with respect to a fixed, north-south meridian. See FIG. 13.

The miniceramics 25 are advanced in abutting relationship along the tracks 30 to stops 34 at the end of open areas 36 from which they may be removed. The advance may be accomplished by means such as mounting the guide tracks 30 on a linear vibratory feeder (not shown).

Figure 4:
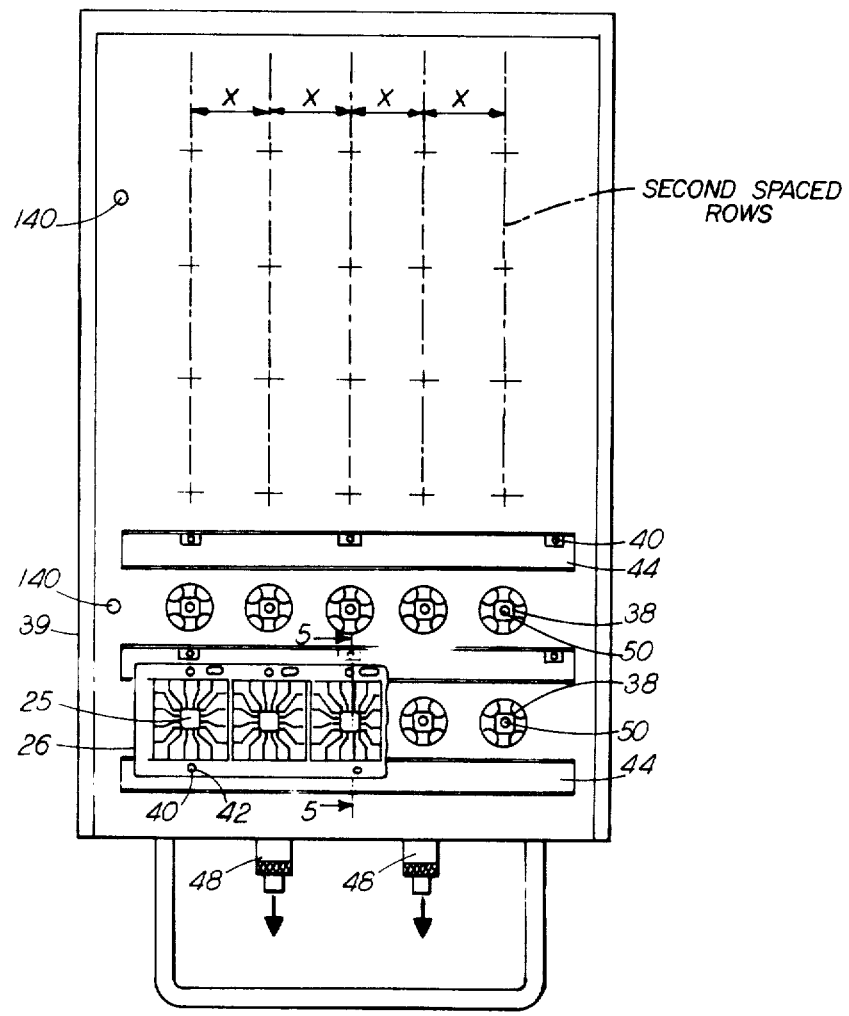
FIG. 4 is a plan view of an anvil assembly to which the removed miniceramics are ultimately transferred for bonding.
Figure 5:
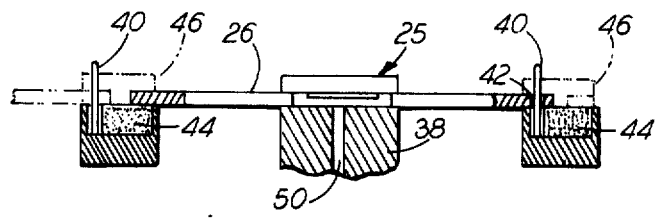
FIG. 5 is an enlarged cross section of one position of the anvil assembly showing a lead frame and miniceramic in place for bonding.

Referring now to FIGS. 4 and 5, each miniceramic 25 is placed on a lead frame 26 over a bonding anvil 38 supported in an anvil assembly 39. The lead frames 26 are retained in position by pins 40 in apertures 42 and magnets 44 which attract magnetic clamping strips 46 (shown in phantom in FIG. 5 only). The miniceramics 25 are retained in position by evacuating the anvil assembly 39, which is hollow, through flexible hoses 48 connected to a source of vacuum (not shown). The vacuum is applied to miniceramics 25 through an axial aperture 50 in each anvil 38. Although in this case, the miniceramics 25 are mechanically symmetrical, they are not electrically symmetrical and, therefore, must be properly oriented. Also they must be precisely positioned with respect to the lead frame 26 for bonding thereto. A fiducial mark 52, refer to FIG. 1, indicates the orientation of the miniceramics and they have the same row orientation, with respect to the rows in the anvil assembly 39, as they have in the guide tracks 30, except that they are inverted.

Apparatus Components for Transferring the Miniceramics

Figure 6:
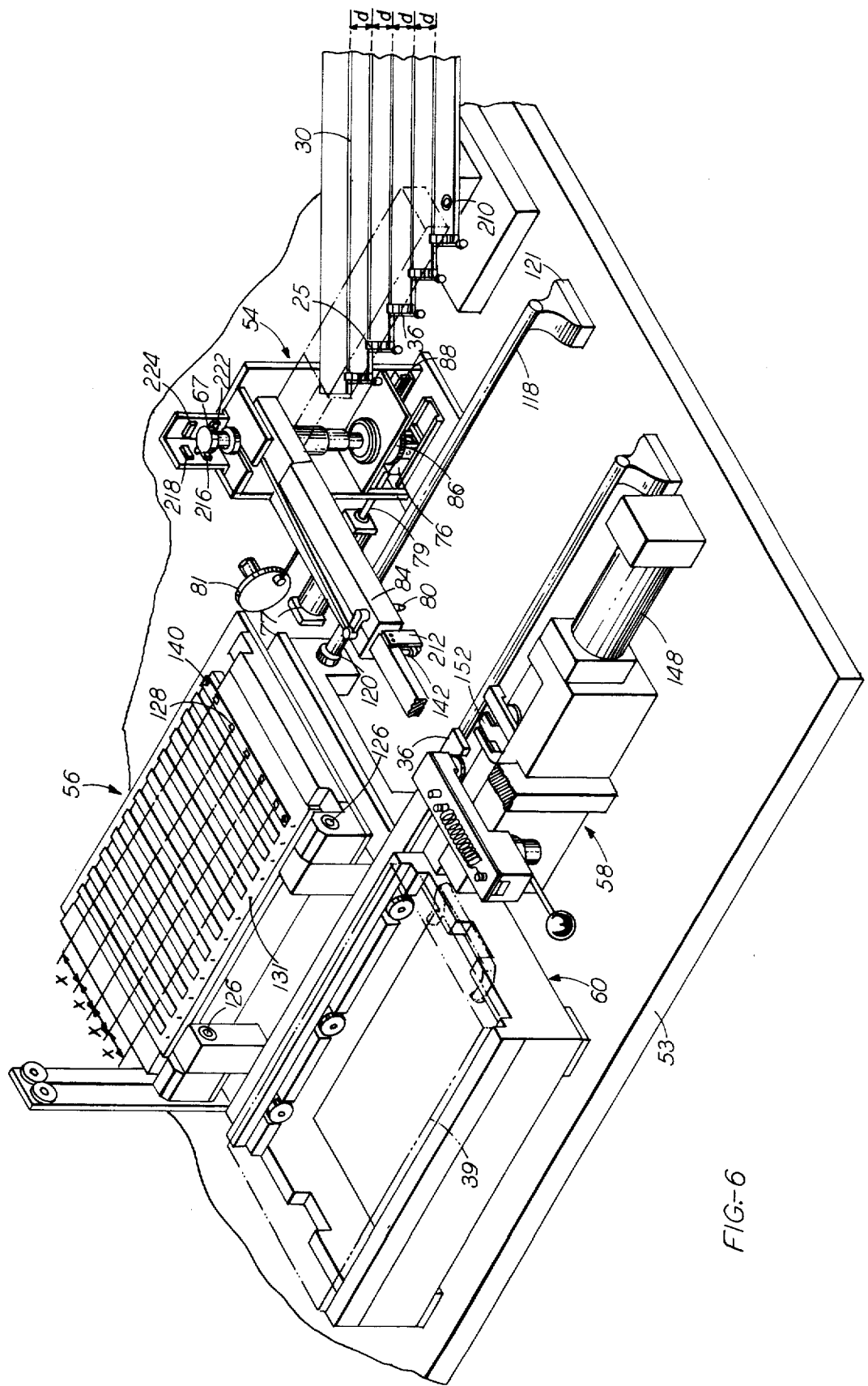
FIG. 6 is an isometric view of an apparatus, for transferring the miniceramics from the guide tracks to the anvil assembly, showing the cooperative relationship of major apparatus components such as a transfer table, transport mechanism, index mechanism and discharge section.

Referring now to FIG. 6, the relationship of the major components is shown for transferring the miniceramics 25 from the guide tracks 30 to the anvil assembly 39 (shown in phantom). The components, mounted on a plate 53, are designated generally as a transport mechanism 54, a transfer table 56, an indexing mechanism 58 and a discharge section 60. The operation of each of these components and its cooperation with the others will be described in order, and more fully, in the following paragraphs.

Figure 7:
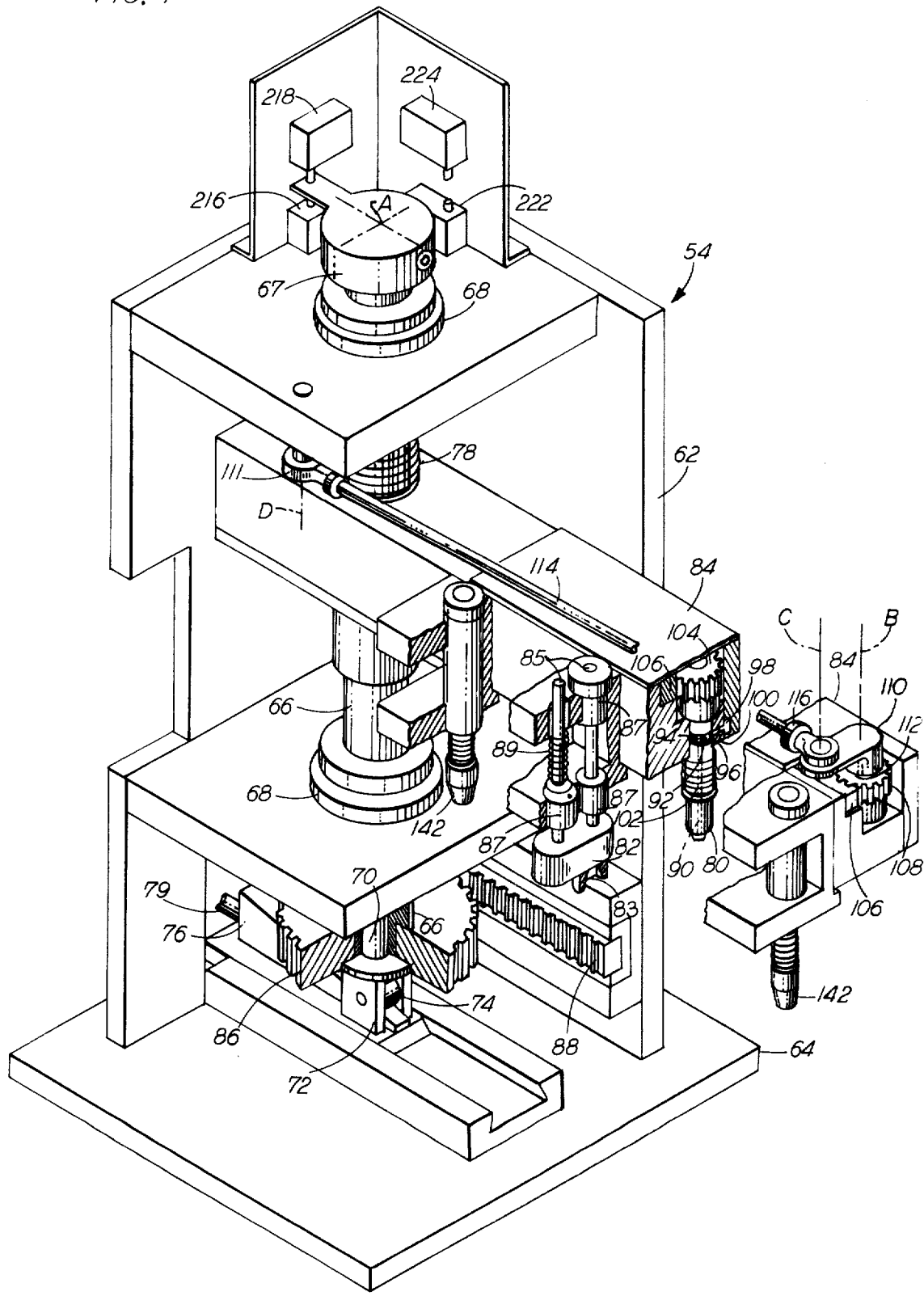
FIG. 7 is an isometric view of the transport mechanism.

(a) Transport Mechanism 54. Referring now to FIGS. 6 and 7, a column 62 mounted on a base 64 supports a tubular shaft 66 and cam 67 for both vertical and rotational movement. The shaft 66 is journaled in bearings 68 and supported at its lower end by a yoke 72. A cylindrical portion 70 of the yoke 72 is inserted in the bore of the shaft 66 and permits the shaft to pivot about the yoke.

The yoke 72 retains a roller 74 which engages the sloped surface of a cam 76 moved by air cylinder 77 and its piston rod 79. In addition to the weight, the shaft 66 is biased downward by a spring 78 to assure that the vertical motion of the shaft will follow the movement of the cam 76. Thus, operation of the cam 76 toward or away from the shaft 66 by the air cylinder 77 moves the shaft up or down, respectively, to raise or lower a plurality of vacuum pickups 80 and corresponding locating members 82. There is one pickup 80 and one locating member 82 for each miniceramic 25 and the pickups and locating members are resiliently mounted for vertical movement in a transfer arm 84 which is fixed to the shaft 66.

A gear 86 pinned to the shaft 66 engages a rack 88 mounted for sliding movement tangential to the gear. A link couples the rack 88 to a crank disk 81 driven by a motor and solenoid operated clutch (neither shown). Each actuation of the clutch rotates the disk 81 one-half of a revolution. This in turn, moves the rack 88 from one end of its travel to the other and rotates the shaft 66 so that the arm 84 swings from an angular position over the tracks 30 to a position over the table 56 or vice versa. Although the cam 76 is described as being operated by an air cylinder, and the rack 88 by a motor and a one-half revolution clutch, they may be actuated by any other suitable means. Two movements of the cam 76, one away and one toward the shaft 66, are timed to occur at each end of stroke of the rack 88 to pickup, deposit and locate the miniceramics 25 on the table 56.

To pickup and deposit the miniceramics 25 in the proper orientation and location, each pickup 80 includes a bore 90 and an aperture 92 extending from the bore 90 to an annular groove 94 in the journal surface. An aperture 96 in the bearing surface aligns with the groove 94 to apply vacuum from a manifold 98, connected to a source of vacuum (not shown) through passage 100, to the groove 94 and, thereby, to the bore 90 and to the end of the pickup 80.

Each pickup 80 is free to move axially, i.e., vertically, to compensate for slight differences in elevation of the miniceramics 25, but is biased downward by a spring 102. Each pickup 80 is retained in place by a pinion 104, fastened to it by a set screw or the like, which engages a rack 106.

The rack 106 also engages another pinion 108 which is the same pitch diameter as the pinion 104. A lever arm 110 and the pinion 108 are fixed to a shaft 112 and supported in the transfer arm 84 so that movement of the arm 110 rotates the pinion 108. Accordingly, all pinions 104 rotate the same angular amount as the lever arm 110.

After the miniceramics 25 are vacuum attached to pickups 80, they are rotated counterclockwise an amount equal to the clockwise rotation of the transfer arm 84 less the angle between the arm at pickup and the tracks 30. This is done as the transfer arm rotates 90° clockwise about shaft 66 (pivot point A in FIG. 13). In this apparatus, the transfer arm pivots 90° clockwise to deposit the miniceramics 25 on the transfer table 56 and, therefore, the miniceramics are rotated 90° less the angle between the arm and the tracks.

The rotation may be accomplished by moving the rack 106 with an air cylinder or driving the pinion 108 with a small stepping motor. However, a linkage mechanism, such as that of the instant invention, is extremely advantageous in that it requires no electrical controls and wiring, or pneumatic control and piping, and a very minimum of maintenance.

The elements of the mechanism include the transfer arm 84; the pinion 108 which engages the rack 106; and a link 114 joined to the arm 110 by a spherical ball joint 116 at one end and to a fixed point on the column 62 by a similar ball joint 111 at the other end.

Figure 13:
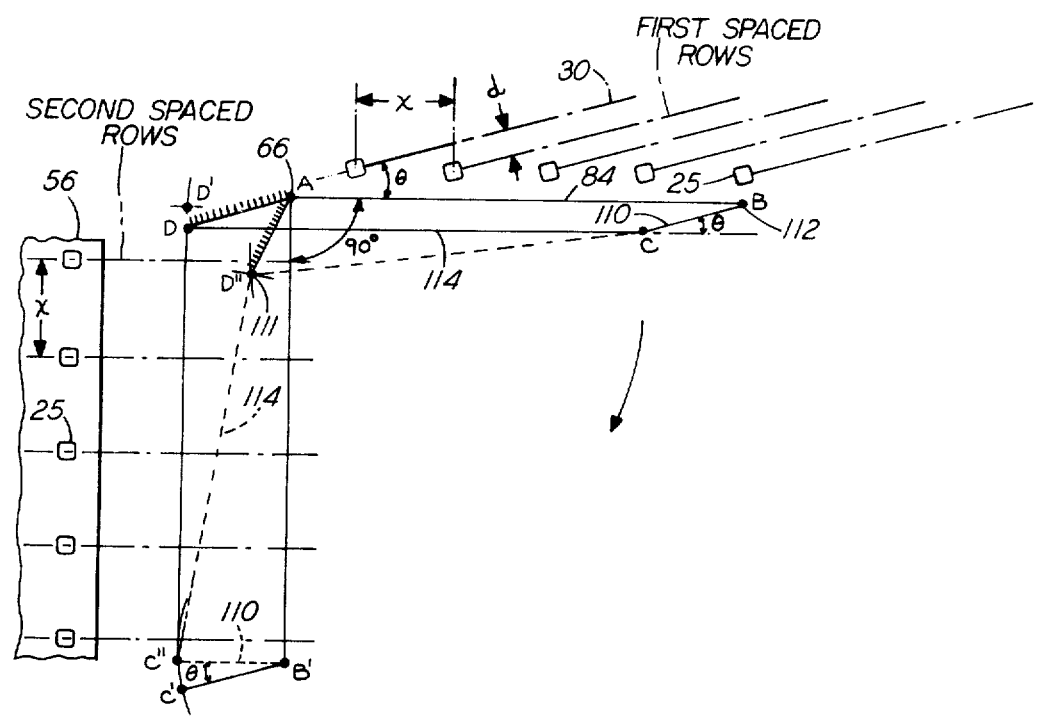
FIG. 13 is a schematic diagram of orienting linkage.

Referring now to FIG. 13, which is a schematic diagram of the linkage mechanism, parallel links $AB = CD$ and $BC = AD$ as shown and the link AD is fixed. For convenience of explanation and illustration, the link BC has been made parallel to the rows (called "first rows") of miniceramics 25 in guide tracks 30 which make an angle $\theta$ with the transfer arm 84 at pickup and with the direction of movement of the table 56. The angle $\theta$ is chosen by orienting plate 32 having tracks 30 so that the spacing "x" along or parallel to the arm 84 across the first miniceramics 25 in the tracks 30 is equal to the desired spacing "x" between the rows (called "second rows") of miniceramics 25 on the table 56. When link AB (transfer arm 84) is pivoted 90° clockwise about A, link BC (lever arm 110) will assume the position B'C' parallel to its original position and, therefore, at an angle $\theta$ with the first rows of miniceramics 25 on the table 56. Since each pickup 80 is mechanically connected to the arm 110 (link BC) through the rack 106 and pinion 104, its angular orientation follows that of the arm 110 which is at an angle $\theta$ with respect to the first rows on the table 56. The angle $\theta$ is reduced to zero by repositioning B'C' to B'C" parallel to the first rows in the table 56. This may be done in a number of well known ways. For example, using the length of the link CD (link 114) as a radius and points C and C" as centers, D' may be located. But there then may be mechanical interference between links AB and CD. If interference must be eliminated, a shorter length may be chosen for CD and the same centers used to locate a new point D" which will eliminate the interference and at the same time position the arm 110 (link BC) properly. It should be noted that, although the starting position of the link BC was assumed parallel to the guide tracks 30 for purposes of convenience in explanation, it is not necessary in practice to start the link in this position. It is only necessary to chose the length of CD" and locate D" such that BC rotates clockwise through an angle from a position B'C' to B'C" during the rotation of arm 84. Thus, the desired spacing "x" for the second row spacing is obtained very advantageously by: (1) choosing the angle $\theta$ between the tracks 30 and arm 84 such that the first spacing "d" between the tracks 30 divided by $\sin \theta$ equals the second spacing "x"; and (2) correcting for the angle $\theta$ by choosing an appropriate length for CD" and location for the point D". Such spacing change, i.e., from $d$ to $x = (d/\sin\theta)$ permits the use of a much smaller first spacing between first rows of miniceramics 25 in handling trays than the relatively large second spacing between second rows on the table 56 necessitated by the same second spacing of the miniceramics 25 on the lead frames 26. The ability to use the smaller first spacing for the trays reduces the size and number of trays required.

Referring again to FIGS. 6 and 7, the miniceramics 25 are precisely positioned and oriented by the members 82. The members 82 include a truncated, pyramidal cavity 83 shown in partial section and mounted on shafts 85 which slide vertically in ball bushings 87. The members 82 are biased downward by a spring 89. The distance between the centers of the pyramidal cavity 83 and the pickup 80 is equal to the distance between columns of vacuum support pedestals on the transfer table 56 (a column is transverse to and a row is parallel to the direction of table movement) to be described next. As the transfer arm 84 lowers to place one column of miniceramics 25 on supports on the table 56, the cavities 83 settle over the miniceramics 25 previously deposited on the supports in the adjacent column. The sloped sides of the cavity 83 rotate the miniceramics 25, if necessary, and force them toward the center of the cavity until they span the cavity walls. When this condition is reached the miniceramics 25 are oriented and located and the downward progress of the members 82 is halted. However, the bushings 87 slide along the shafts 85, to permit the arm 84 to descend further to complete depositing the miniceramics 25 which are on the pickups 80 in the next column of supports with one miniceramic 25 on one support in each row.

Figure 8:
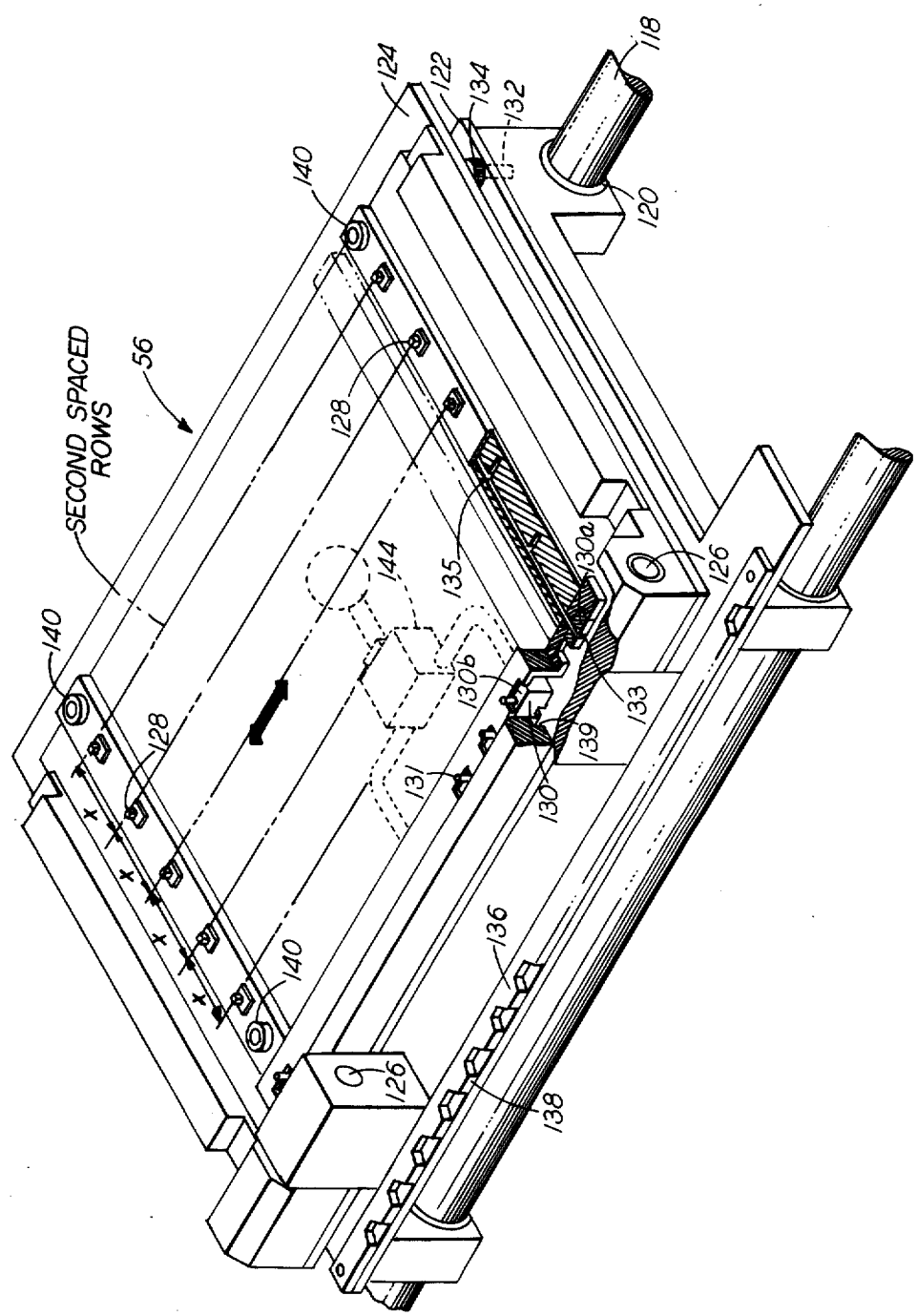
FIG. 8 is an isometric view of the transfer table.

(b) Transfer Table 56. Referring now to FIGS. 6 and 8, the table 56 is mounted on rods 118 and linear ball bushings 120 for movement past the transport mechanism 54. The rods 118 are fixed to the plate 53 by supports 121. The table 56 includes a lower portion 122 containing the ball bushings 120 and an upper portion 124 which may be pivoted at one edge about pins 126, fixed in the lower portion 122, to an inverted position over the anvil assembly 39 in the discharge section 60. The upper section also includes vacuum support pedestals 128 and vacuum slide valves 130. One valve 130 controls the vacuum to one column of pedestals 128 and is slid left or right, to close or open the valve, respectively, by contacting the operating lever 131. When the valve 130 is in the right-hand position, e.g., valve 130a, an aperture 133 aligns with a passage 135 from a supply manifold 139 to the pedestals 128. In the lefthand position the valve 130, e.g., valve 130b, blocks the passage and shuts off the vacuum.

The plane of the top surface of the pedestals 128 must be nearly horizontal to suit the pickups 80 when the miniceramics 25 are released therefrom and, therefore, a screw 132 and locknut 134 are provided at each end of the lower portion 122 of the transfer table 56 to level the upper portion 124.

After each column of miniceramics 25 is deposited on the pedestals 128, a new column of pedestals must be indexed into position to receive the next column of miniceramics. Accordingly a rack 136, having teeth 138 spaced to suit the spacing of the columns of pedestals 128, is mounted on the lower portion 122 of the transfer table 56 for engagement by the indexing mechanism 58 to be described subsequently. However, precise alignment of the transfer arm 84 with the table 56 and pedestals 128 is provided by guide bushings 140 which are at the end of and aligned with each column of pedestals 128. As the transfer arm 84 is lowered to place the miniceramics 25 on the pedestals 128, resiliently mounted pilots 142 on the arm 84 enter the bushings 140 to precisely located the arm 84 and table 56 with respect to each other.

As will be further explained, two of the bushings 140 in upper portion 124 of the table 56 are also used in cooperation with two like bushings 140 in the anvil assembly 39 to precisely position the upper portion 124 and the anvil assembly 39 with respect to each other. When the upper portion 124 is pivoted about the pins 126 to a position above the anvil assembly 39, a pair of locating pins (not shown) are inserted through the two bushings 140 in the upper portion 124 and the corresponding bushings 140 below them in the anvil assembly 39 to precisely align the assembly and upper portion.

When assembly 39 and upper portion 124 are aligned, the vacuum is removed from all pedestals 128 by operation of the vacuum valve 144, fixed to the upper portion, which removes the vacuum completely from the supply manifold 139 and thus all pedestals 128.

Figure 9:
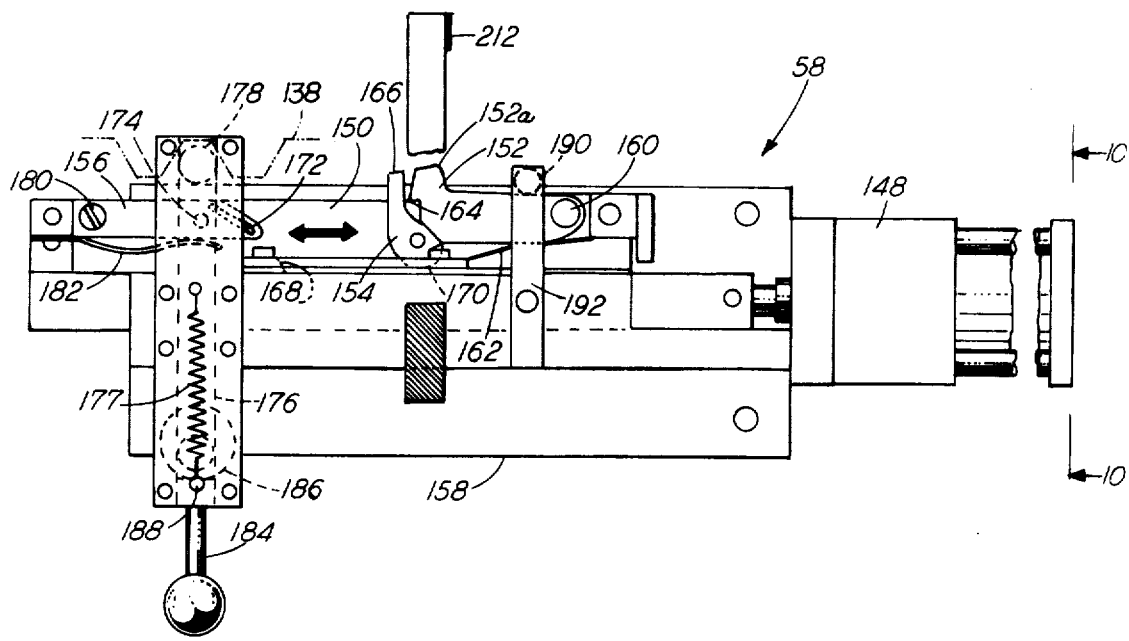
FIG. 9 is a plan view of the indexing mechanism.
Figure 10:
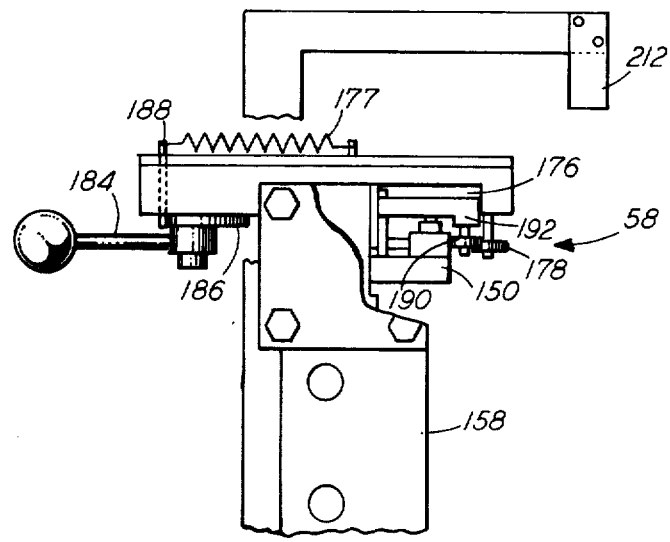
FIG. 10 is an end elevation of the indexing mechanism of FIG. 9.

(c) Indexing Mechanism 58. Referring now to FIGS. 6, 9 and 10 an air cylinder 148 is fastened to a slide 150 retained for horizontal sliding movement (as indicated by the arrows) in a support bracket 158 mounted on the base 53. A pawl 152, a latch 154, and release 156 are mounted for pivotal movement on the slide 150. The pawl 152 is biased for clockwise rotation about a stud 160, by a leaf spring 162, and includes a ledge 164. The latch 154 is biased clockwise so that a latching surface 166 engages the ledge 164 and holds the pawl 152 in engagement with the rack teeth 138. The latch surface 166 is disengaged from the ledge 164 by a cam surface 168 engaging a toe 170 of the latch 154 at the end of the leftward stroke to allow a back corner 152a of the pawl 152 to ride up the face of a rack tooth to disengage the pawl from the rack 136.

At the start of the index stroke to the left, before the pawl 152 engages one of the rack teeth 138, a cam surface 172 on the release 156 engages a follower 174 fixed in a slide 176. This moves the slide 176, which is biased toward the rack 136 by a tension spring 177, away from the rack 136. Accordingly, a roller 178, which is supported on the slide 176 and engages the rack 136 to maintain the transfer table 56 stationary until indexed, is disengaged from the rack 136 until the cam surface 172 is past the follower 174. When the surface 172 passes the follower 174, the spring 177 moves the slide 176 back and the roller 178 re-engages the rack 136.

The release 156 is mounted for pivotal movement about a shoulder screw 180 and is biased counterclockwise by a leaf spring 182. On the return stroke of the slide 150, the cam surface 172 again engages the follower 174 but, since the roller 178 is engaged with the rack 136, the slide 176 cannot move toward the rack 136 and, instead, the release 156 pivots clockwise to allow the cam surface 172 to pass the follower 174. The spring 182 returns the release 156 to its initial position for the next indexing stroke.

A cam 186 is attached to a lever 184 and engages a follower 188 which passes through and is fixed in the slide 176. The roller 178 may be manually disengaged from the rack 136 and the condition maintained as long as desired by rotating the lever 184, and thereby the cam 186, 90° to retract the slide 176.

When the slide 150 is in its extreme position to the right, a roller 190 mounted on a bracket 192 contacts the pawl 152 and holds it disengaged from the rack 136 so that the table 56 can be returned to its starting position.

Figure 11:
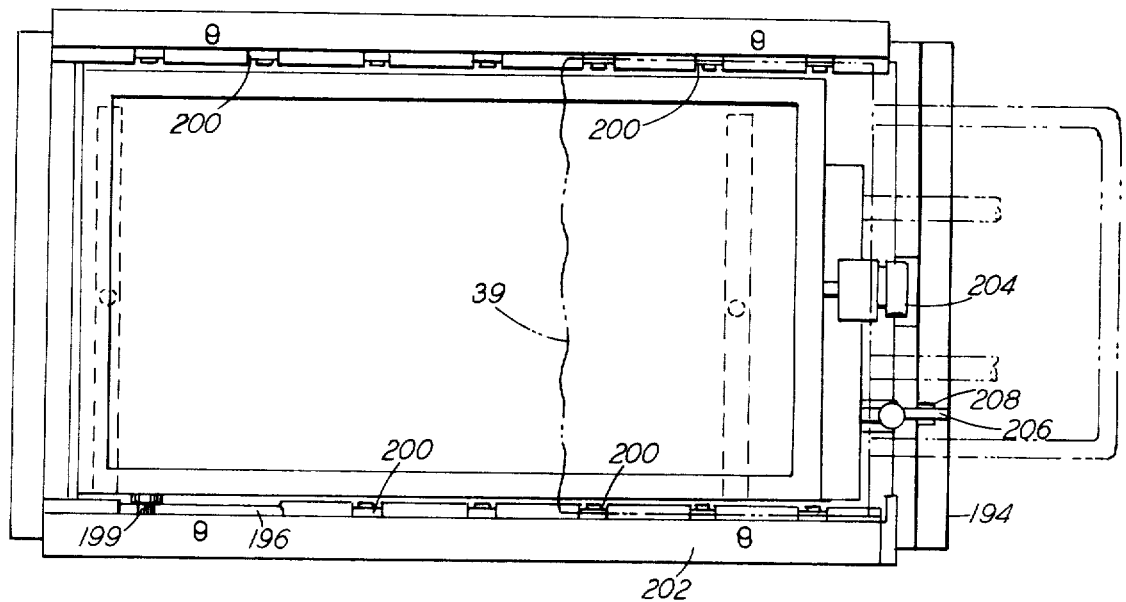
FIG. 11 is a plan view of the discharge section.
Figure 12:
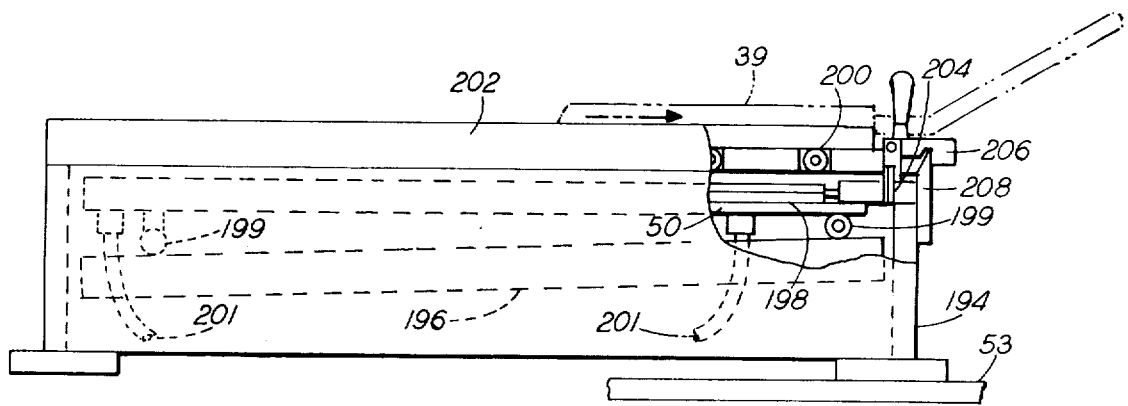
FIG. 12 is a side elevation of the discharge section.

(d) Discharge Section 60. Referring now to FIGS. 6, 11 and 12, a housing 194 mounted on the base 53 includes rails 196 sloped upward to the right, cooling carriage 198 which rolls along the rails on wheels 199, and support rollers 200 mounted in guides 202 for receiving the anvil assembly 39 (partially shown in phantom).

The carriage 198 is constructed to have cooling water flowing through it. The water is supplied and exhausted through flexible hoses 201.

The hot anvil assembly 39 is pulled to the right from the thermocompression bonding apparatus (not shown), at the finish of a mass bonding cycle, onto the support rollers 200. In so doing, the forward end of the anvil assembly 39 engages a catch 204 on the carriage 198. Further, movement to the right causes the carriage to ride up the sloped rails 196 until the upper surface of the carriage engages the underside of the anvil assembly 39. At this point, a latch 206 drops over a latching member 208 to hold the assembly 39 in contact with the carriage 198 to cool the assembly for loading and unloading.

OPERATION OF THE APPARATUS

Referring now to FIGS. 6-12, the transport mechanism 54 is positioned with respect to the guide tracks 30 and the transfer table 56 so that the transfer arm 84 may be pivoted from a predetermined angular position above the track 30 to a position transverse to the table 56. Starting with the transfer arm 84 in its raised position over the tracks 30 and the miniceramics 25 fed to the open areas 36 against the stops 34, the cam 76 is retracted to lower the arm 84 by actuating the cylinder 77. As the arm nears its lowermost position, the outermost pilot 142, enters a guide bushing 210 in the support 32 and aligns the arm with the miniceramics 25. When the cam 76 is fully withdrawn and the arm 84 is in its lowermost position, the cam 67 closes microswitch 216 and energizes a relay which applies vacuum through the passage 100 to the pickups 80 as previously described and actuates air cylinder 77 again. This moves the cam 76 toward the shaft 66 to raise the arm 84 and remove the miniceramics 25 from the tracks 30. When the arm 84 reaches its uppermost position, the cam 67 closes microswitch 218 and energizes a relay which actuates the one-half revolution clutch so that the crank disk 81 rotates one-half of a revolution and the rack 88 is moved to the right. This pivots the arm 84 clockwise to a position over the support pedestals 128 on the transfer table 56. During this movement, the linkage mechanism (C, D, A, B) rotates the lever arm 110 (link BC) and, therefore, the miniceramics 25 rotate counterclockwise with respect to the arm 84 to align re-orient the miniceramics 25 relative to the second rows formed by the pedestals on the table 56. At the end of the movement of the rack 88, a portion of the rack closes a microswitch (not shown) which energizes the relay that actuates the air cylinder 77 to lower the arm 84.

The starting condition for the table 56 is (1) the table at the extreme right of its travel with the first column of pedestals 128 beneath the arm 84, (2) the roller 178 engaging the rack 136, and (3) the vacuum applied to the first column of pedestals 128. As the arm 84 approaches its lowermost position pilots 142 enter the housings 140 locating the arm precisely with respect to the pedestals 128, the cam 67 closes microswitch 222 which (1) energizes a relay to remove the vacuum from the pickups 80 and (2) actuates air cylinder 77 to raise the arm 84. Since the vacuum is already applied to the pedestals 128, miniceramics 25 transfer to the pedestals. When the arm 84 reaches its upper position, the cam 67 closes microswitch 224 which energizes the clutch relay. This (1) rotates the crank disk 81 one-half of a revolution so that the rack 88 moves to the left and pivots the arm 84 back to its starting position over the tracks 30, and (2) actuates the air cylinder 148 to index the table 56 to position the next column of pedestals 128. As before, at the end of the movement of the rack 88, a portion of the rack closes a microswitch (not shown) to actuate air cylinder 77 to raise and lower the pickups 80.

To apply the vacuum to the pedestals 128, a leaf spring 212 may be mounted on the base 53, at a height above the base sufficient to clear the upper portion 124 of the table 56 and contact the levers 131. Accordingly, when the table 56 is indexed to the left to position a new column of pedestals 128, the leaf spring 212 contacts the lever 131, slides the valve 130 to the right relative to the table 56 and opens the valve, thus, admitting vacuum to the new column of pedestals 128. When the valve 130 reaches the extreme of its travel, the spring deflects allowing the lever 131 to pass beneath.

Other means may be used for moving the valve 130. For example, the leaf spring may be replaced by a pivoting element, such as a bell crank, and the movement of the arm 84 transferred to the levers 131 to open the valves.

After the first index of the table 56, the arm 84 proceeds through the same events as before. However, as the arm 84 descends over the pedestals 128 thereafter, the locating members 82 descend over the miniceramics 25 deposited on the column of pedestals 128 on the previous cycle. Thus, after the first cycle, each descent of the arm 84 over the table 56 deposits one column of miniceramics 25 and precisely locates and orients the previous column.

The events described above are repeated until (1) an array (or matrix) of miniceramics 25, with the second spacing "x" between rows, and with a fixed spacing between the columns, has been formed and the table 56 is full, (2) the table is in its extreme left position so that it opens a microswitch (not shown) which removes power from the controls and (3) the arm 84 is in its up or starting position over tracks 30. Also, at this time the anvil assembly 39 is (1) withdrawn from the mass bonding apparatus, (2) positioned in the discharge section 60, and (3) loaded with lead frames 26 for bonding.

The upper portion 124 of the table 56 is manually pivoted about the pins 126 to a position over the anvil assembly 39. In this position, the miniceramics 25 are inverted and the conductor pattern 24 is against the leads 28 of the frame 26. Close fitting locating dowels are inserted through the bushings 140 in the upper portion 124 of the table 56 into identical bushings 140, refer to FIG. 4, in the anvil assembly 39. When the assembly 39 and portion 124 have been precisely positioned with respect to each other, vacuum is admitted to the anvil assembly and the vacuum valve 144 on the upper portion 124 is closed to remove the vacuum from the pedestals 128 so that the miniceramics 25 transfer to the anvil assembly 39 for bonding to the lead 28.

The upper portion 124 is returned to its initial position over the lower portion 122 and the lever 184 is rotated to withdraw the roller 178 from engagement with the rack 136. The table 56 is then returned manually to its starting position for reloading.

While there has been described herein practical embodiments of the present invention, it is to be understood that various modifications and refinements which depart from the disclosed embodiment may be adapted without departing from the spirit and scope of the present invention.

What is claimed is:

1. A method of transferring articles having an initial row orientation from first rows having a first spacing to second rows having a second spacing, comprising the steps of:
    removing said articles from points located on the first-spaced rows along a line angular to said rows such that the spacing of the articles along the line is equal to the second row spacing;
    reorienting the articles to re-establish the initial row orientation relative to the second rows; and
    depositing the articles having the initial row orientation, in said second-spaced rows.

2. A method of transferring articles having a first row orientation from first rows having a first spacing to second rows having a second spacing, comprising the steps of:
    removing said articles from points located on the first-spaced rows along a line along which the articles have the second row spacing;
    re-establishing the first row orientation of the articles with respect to the second rows; and
    depositing the articles in the second rows having the second spacing to provide new rows of articles with the first row orientation and the second row spacing.

3. A method of transferring articles, as recited in claim 2, wherein the removing step comprises:
    contacting the first articles in each row, said first articles being along the line along which the articles have said second row spacing, with a vacuum pickup supported by a pivotable arm, there being one pickup for the first article in each row;
    reducing the pressure below atmospheric in the pickups to adhere an article to each pickup; and
    raising the arm to lift the articles from the rows.

4. A method of transferring articles, as recited in claim 3, wherein the depositing step comprises:
    pivoting the arm from the position along the line along which the articles have said second spacing to a position normal to the second spaced rows;
    lowering the arm to lower the pickups; and
    raising the pressure in the pickups to deposit the articles into the second spaced rows.

5. A method of transferring articles, as recited in claim 4, wherein the lowering of the arm includes the further step of precisely positioning the articles previously deposited by the pickups.

6. A method of transferring articles, as recited in claim 5, wherein the step of re-establishing the first row orientation of the articles, comprises:
    rotating the pickups counter to the direction in which the arm pivots.

7. A method of transferring articles, as recited in claim 6, wherein the step of re-establishing the first row orientation of the articles further comprises:
    rotating the pickups counter to the direction in which the pickup arm pivots an amount sufficient to compensate for an angular difference between the first and second spaced rows.

8. A method of transferring articles, as recited in claim 7, wherein the rotation of the pickups occurs simultaneously with the pivoting of the arm.

9. A method of transferring articles, as recited in claim 8, wherein the step of depositing the articles comprises the further step of:
    inverting the articles.

10. A method of transferring semiconductor devices having an initial row orientation from first rows having a first spacing to bonding apparatus having second rows of a second spacing, comprising the steps of:
    supporting vacuum pickups, one for the first device in each row, for rotation in a pivotable arm;
    positioning the arm angular to the first spaced rows of devices and adjacent said devices;
    evacuating the pickups to pickup the first device from each row;
    re-establishing the initial row orientation of the devices with respect to the second rows while pivoting the arm to a position over and parallel to a column of evacuated supports and normal to the second spaced rows formed by such supports;

placing and precisely positioning the devices on the evacuated supports;

removing the vacuum from the pickups to deposit said devices on the supports in their initial row orientation with respect to the second rows;

returning the arm to said angular position adjacent the devices in said first spaced rows;

repeating the preceding steps to form a matrix of such devices on the evacuated supports;

inverting and positioning the devices adjacent the bonding apparatus; and applying vacuum to the bonding apparatus while removing the vacuum from the supports to transfer the devices to said apparatus.

11. Apparatus for transferring articles, comprising:
a base;
means mounted on the base for guiding the articles along parallel first rows having a first spacing, the articles having an initial row orientation with respect to the first rows;
means pivotally mounted on the base for simultaneously removing at least two articles from the guiding means at points located along a line angular to the first rows on which the articles have a second spacing, to second rows having the same second spacing;
means for re-establishing the initial row orientation relative to the second spaced rows; and
means mounted on the base for receiving and supporting the removed articles in rows having the second spacing and the articles having the initial row orientation.

12. Apparatus for transferring articles, as recited in claim 11, wherein the removing means comprises:
an elongated member pivotally movable from an angular position acute to the first-spaced rows to a position normal to the second rows; and
a pickup member for each row, each pickup member being evacuable and supported by the elongated member for rotational movement relative thereto.

13. Apparatus for transferring articles, as recited in claim 12, wherein the means for re-establishing the initial row orientation of the articles comprises:
a driven member mounted on each pickup member;
a driving member to engage each driven member; and
means for actuating the driving member to rotate the driven members relative to the elongated member.

14. An apparatus for transferring articles, as recited in claim 13, wherein the actuating means is a link mechanism.

15. Apparatus for transferring articles, as recited in claim 14, wherein the means for receiving and supporting the articles further comprises:
a pedestal for each article to be supported, each pedestal having a support surface for the article and a vacuum passage intersecting said surface; and
means for evacuating the passage to retain the article on the pedestal.

16. An apparatus for transferring articles, as recited in claim 15, wherein the means for receiving and supporting the articles further comprises:
a table, slidably supported by the base, the pedestals being mounted in columns thereon and separated to the extent of the second spacing, said table having a vacuum supply manifold and valve means to regulate the vacuum to the pedestals and passages therein; and
means for indexing the table to position the columns of pedestals to receive the articles.

17. Apparatus for transferring articles, as recited in claim 16, wherein the means for re-establishing the initial row orientation of the articles further comprises:
locating members, one for each row, mounted on the elongated member for contacting and precisely positioning the articles placed on the supports.

18. Apparatus for transferring articles, as recited in claim 17, wherein the table further comprises:
a pivotal mounting to permit rotation of said table about one edge to invert the articles.

19. An apparatus for transferring semiconductor devices having a first row orientation from first-spaced rows to a bonding assembly having second-spaced rows, which comprises:
a base;
guide tracks mounted on the base for establishing the devices in first parallel rows having a first spacing between said rows;
a transfer table having a vacuum manifold, positioned adjacent the guide tracks on the base, pivotable about one edge to an inverted position;
supports on the table for the devices, the supports being arrayed in columns and rows wherein the space between rows is the second spacing, each said support having a device support surface and an axial passage intersecting such surface, and the axial passage of each such support in a column being joined to the vacuum manifold through a vacuum valve to apply or remove vacuum from each column of supports;
a vacuum source flexibly connected to the manifold;
means for indexing the table to position the supports to receive the devices and form second-spaced rows of said devices;
an elongated member for transferring the devices from the first rows to said supports to form second rows, said member being supported at one end from the base for pivotal and vertical movement from a position angular to the first rows, such that the spacing between the first devices in said first rows along the member is equal to the second spacing, to a position normal to the second rows on the table whereby the second rows have the second spacing;
means for aligning the elongated member precisely with the tracks and the columns of supports;
a pickup member for the first device in each track, resiliently supported by said elongated member for rotation relative thereto and having an axial vacuum passage connected to a source of vacuum;
a pinion fixed to each pickup member;
a rack for engaging each pinion to rotate each pickup;
linkage means for moving the rack to rotate said pickup members counter to the rotation of the elongated member to re-establish the row orientation of the devices;
locating members, resiliently mounted on the arm, for precisely positioning the devices on the supports;
means for positioning the transfer table with respect to the bonding assembly; and
means for engaging the bonding assembly with the devices to transfer retention of the devices from the transfer table to the bonding assembly.

* * * * *